(12) United States Patent
Park et al.

(10) Patent No.: US 8,894,792 B2
(45) Date of Patent: Nov. 25, 2014

(54) MANUFACTURING METHOD OF FUNCTIONAL MATERIAL USING SLICE STACK PRESSING PROCESS AND FUNCTIONAL MATERIAL THEREBY

(75) Inventors: Su Dong Park, Changwon-si (KR); Hee Woong Lee, Changwon-si (KR); Bong Seo Kim, Changwon-si (KR); Min Wook Oh, Changwon-si (KR)

(73) Assignee: Korea Electrotechnology Research Institute (KR)

( * ) Notice: Subject to any disclaimer, the term of this patent is extended or adjusted under 35 U.S.C. 154(b) by 1407 days.

(21) Appl. No.: 12/344,399

(22) Filed: Dec. 26, 2008

(65) Prior Publication Data

US 2010/0098957 A1    Apr. 22, 2010

(30) Foreign Application Priority Data

Oct. 16, 2008    (KR) .................. 10-2008-0101557

(51) Int. Cl.
| | | |
|---|---|---|
| B32B 15/04 | (2006.01) | |
| B32B 37/02 | (2006.01) | |
| H01L 35/16 | (2006.01) | |
| B32B 7/02 | (2006.01) | |
| B32B 37/18 | (2006.01) | |
| H01L 35/34 | (2006.01) | |
| B32B 27/18 | (2006.01) | |
| H01L 35/26 | (2006.01) | |

(52) U.S. Cl.
CPC ............... *B32B 37/18* (2013.01); *H01L 35/16* (2013.01); *B32B 2307/20* (2013.01); *B32B 7/02* (2013.01); *B32B 2310/024* (2013.01); *H01L 35/34* (2013.01); *B32B 27/18* (2013.01); *H01L 35/26* (2013.01)
USPC .......................................................... 156/245

(58) Field of Classification Search
CPC .... C04B 20/0048; C04B 14/02; C04B 41/45; C08L 2666/02
USPC .......................................................... 156/245
See application file for complete search history.

(56) References Cited

U.S. PATENT DOCUMENTS

| | | | | | |
|---|---|---|---|---|---|
| 3,969,430 | A | * | 7/1976 | Kalnin et al. .................. | 525/435 |
| 5,108,515 | A | * | 4/1992 | Ohta et al. ..................... | 136/201 |
| 5,168,339 | A | * | 12/1992 | Yokotani et al. ................ | 257/64 |

(Continued)

FOREIGN PATENT DOCUMENTS

| | | | |
|---|---|---|---|
| CN | 1843667 A | * | 10/2006 |
| JP | 63226980 A | * | 9/1988 |

(Continued)

*Primary Examiner* — Philip Tucker
*Assistant Examiner* — Vicki Wu
(74) *Attorney, Agent, or Firm* — Park & Associates IP Law, P.C.

(57) ABSTRACT

Disclosed herein are a method for manufacturing a functional material for use in various industrial fields in which anisotropy or physical properties change according to height may be utilized, as well as a functional material manufactured thereby. The method includes the steps of: (1) mixing powders composed of the components of the functional material with a binder to prepare a mixed paste; (2) coating the mixed paste on a substrate, and then separating the coated material from the substrate, thus preparing a slice; (3) repeating step (2) to prepare a plurality of slices, and stacking the slices in a mold; and (4) pressing the stacked slices at a predetermined temperature and pressure. A multifunctional material, such as an anisotropic material having physical properties which change according to the direction of material, or a material having physical properties which change in a graduated manner according to height, may be manufactured in a simple and economical manner.

10 Claims, 7 Drawing Sheets

(56) References Cited

U.S. PATENT DOCUMENTS

| | | | |
|---|---|---|---|
| 5,200,392 A * | 4/1993 | Rao et al. | 505/124 |
| 6,127,619 A * | 10/2000 | Xi et al. | 136/203 |
| 6,180,275 B1 * | 1/2001 | Braun et al. | 429/519 |
| 6,441,296 B2 * | 8/2002 | Hiraishi et al. | 136/201 |
| 6,710,238 B1 * | 3/2004 | Shingu et al. | 136/205 |
| 2005/0076943 A1 | 4/2005 | Cooper et al. | |
| 2009/0079078 A1 | 3/2009 | Willigan et al. | |
| 2009/0134365 A1 | 5/2009 | Sasaki et al. | |

FOREIGN PATENT DOCUMENTS

| | | | |
|---|---|---|---|
| JP | 08153897 A | * | 6/1996 |
| JP | 09307146 A | * | 11/1997 |
| JP | 2003298128 A | * | 10/2003 |

* cited by examiner

| Real Temp. | Electrical resistivity (ohm m) | Seebeck coefficient (V/K) | Power factor | Thermal conductivity (W/mk) | Z | ZT |
|---|---|---|---|---|---|---|
| Out-Plane | | | | | | |
| 5.40E+01 | 5.24E-05 | 2.66E-04 | 1.35E-03 | 0.6372847 | 2.12E-03 | 6.93E-01 |
| 9.89E+01 | 6.00E-05 | 2.63E-04 | 1.15E-03 | 0.6995351 | 1.64E-03 | 6.11E-01 |
| 1.47E+02 | 6.36E-05 | 2.35E-04 | 8.68E-04 | 0.7723108 | 1.12E-03 | 4.72E-01 |
| 1.95E+02 | 6.24E-05 | 2.04E-04 | 6.63E-04 | 0.8358873 | 7.93E-04 | 3.71E-01 |
| 2.42E+02 | 5.85E-05 | 1.70E-04 | 4.91E-04 | 0.9174241 | 5.35E-04 | 2.76E-01 |
| 2.90E+02 | 5.18E-05 | 1.43E-04 | 3.96E-04 | 0.9472298 | 4.18E-04 | 2.35E-01 |

MANUFACTURING METHOD OF FUNCTIONAL MATERIAL USING SLICE STACK PRESSING PROCESS AND FUNCTIONAL MATERIAL THEREBY

FIELD OF THE INVENTION

The present invention relates to a method for manufacturing a functional material, such as an anisotropic material whose physical properties differ according to direction, a material which has physical properties which change according to height, and a thermoelectric material which is used for thermoelectric cooling and thermoelectric power generation, and more particularly to a method of manufacturing a functional material in a simple and economical manner by preparing slices corresponding to the components of the functional material and pressing the slices.

BACKGROUND OF THE INVENTION

As used herein, the term "functional material" refers to an anisotropic material having electrical, optical, thermal, chemical or mechanical properties which change in the horizontal, vertical or diagonal direction with respect to the surface, a material having physical properties which differ according to height, or a material having physical properties which change regularly, irregularly or continuously according to height in a graduated manner. That is, it refers to a material showing various functions because of such anisotropy or physical properties which change in a graduated manner.

Functional materials having such physical properties may be used as thermoelectric materials in kitchen utensils, electric home appliances or thermoelectric elements, and such anisotropy or physical properties changing in a graduated manner also have an application in various industrial fields.

Among materials having such physical properties, thermoelectric materials with important electrical and thermal properties will now be described.

Thermoelectric materials are used in thermoelectric elements for thermoelectric generation and thermoelectric cooling, and typical thermoelectric materials are metallic thermoelectric materials represented by Bi. The most often used metallic thermoelectric materials include Bi—Ag, Cu-constantan, Bi—Bi/Sn alloy, BiTe/BiSbTe, etc. Recently, semiconductor thermopiles having Seebeck coefficients higher that the metal-based materials have been most often used; however, in fields requiring stability, metallic thermopiles are most frequently used. Metallic thermopiles have an advantage of low noise due to low resistivity. However, they have low sensitivity due to a low Seebeck coefficient. For example, in Cu having a Seebeck coefficient of almost zero, the electromotive force caused by the temperature difference does not occur. Among metallic materials, Bi is used as a thermoelectric material due to low thermal conductivity and a high Seebeck coefficient.

In comparison with such metallic thermoelectric materials, semiconductor thermoelectric materials represented by Si show excellent sensitivity due to having a high Seebeck coefficient and, in addition, may be applied directly to existing IC processes. Due to such advantages, the semiconductor thermoelectric materials are being very widely used.

Generally, the thermoelectric performance of the thermoelectric materials is determined by physical properties including thermoelectromotive force (V), Seebeck coefficient ($\alpha$), Peltier coefficient ($\pi$), Thomson coefficient ($\tau$), Nernst coefficient (Q), Ettingshausen coefficient (P), electrical conductivity ($\sigma$), powder factor (PF), figure of merit (Z), dimensionless figure of merit (ZT=$\alpha$ 2 $\sigma$T/K wherein T is absolute temperature), thermal conductivity ($\kappa$), Lorentz ratio (L), electric resistivity ($\rho$), etc.

Particularly, the dimensionless figure of merit (ZT) is an important factor in the determination of thermoelectric conversion efficiency, and when a thermoelectric element is manufactured using a thermoelectric material having a high figure of merit (Z=$\alpha$ 2 $\sigma$/K), it can have an increased efficiency of cooling and powder generation.

Accordingly, it is particularly preferable to use a thermoelectric material having a high Seebeck coefficient ($\alpha$) and electrical conductivity, and thus a high power factor (PF=$\alpha$ 2 $\sigma$). It is most preferable to use a thermoelectric material having a low thermal conductivity ($\kappa$) in addition to such preferred properties. Moreover, it is preferable to use a thermoelectric material having a high Seebeck coefficient ($\alpha$) together with a high ratio of electrical conductivity to thermal conductivity, $\sigma/\kappa$ (=1/TL; mainly in the case of metals).

Various attempts have been made to increase the thermoelectric performance of thermoelectric materials, but such methods have been limited mainly to changing the composition ratio or the kind of elements composing the thermoelectric material.

Such thermoelectric materials are manufactured by powdering the components of the thermoelectric material, sintering and molding the powder, and cutting the molded material for use. In another attempt to improve thermoelectric performance, there is a method of forming a stack structure using MBE (molecular beam epitaxy) or CVD (chemical vapor deposition), thus increasing the dimensionless figure of merit (ZT). However, these methods have problems in that they do not sufficiently improve thermoelectric performance and, in addition, are not economically viable due to a long production time being required.

SUMMARY OF THE INVENTION

The present invention has been made in order to solve the above-described problems occurring in the prior art, and it is an object of the present invention to provide a method of manufacturing a functional material having multifunctional properties in a simple and economical manner by preparing and stacking slices.

To achieve the above object, the present invention provides a method of manufacturing a functional material by the stacking and pressing of slices, the method including the steps of: (1) mixing powders composed of the components of the functional material with a binder to prepare a mixed paste; (2) coating the mixed paste on a substrate to form a coated material, and then separating the coated material from the substrate, thus preparing a slice; (3) repeating step (2) to prepare a plurality of slices, and stacking the slices in a mold; (4) pressing the stacked slices at a predetermined temperature and pressure. The present invention provides a functional material manufactured according to said method.

The method of manufacturing the functional material by the stacking and pressing of slices may include preparing different kinds of materials constituting the components of the functional material, preparing the mixed paste of step (1) using each of the different kinds of materials, preparing the slices of step (2), stacking the slices corresponding to each of the different kinds of materials in the mold of step 3, and subjecting the stacked slices to the pressing process of step (4). Also, the functional material may be manufactured such that the thicknesses of the slice stacks consisting of the different materials differ from each other.

Herein, the functional material may be a thermoelectric material or an anisotropic material which are to be used in thermoelectric elements. The functional material may be manufactured using any one of metal materials, ceramic materials, semiconductor materials and organic materials.

Also, if the functional material may be a thermoelectric material, it is preferably $(Bi_xSb_{1-x})_2Te_3$.

Furthermore, carbon nanotubes may be added to the mixed paste of step (1) in an amount of 0.1-5 parts by weight based on 100 parts by weight of the mixed paste. Moreover, the binder in step (1) may be added in an amount of 10-30 parts by weight based on 100 parts by weight of the mixed paste. In addition, the binder may include one selected from organic materials including thermoplastic resins, thermosetting resins, photocurable resins, silane compounds, polymeric copolymers, self-assembled resins, and combinations thereof.

Also, the substrate in step (2) may be a Cu foil, and step (2) may be carried out by a screen coating process.

Furthermore, step (4) may be carried out by a cold pressing process performed at room temperature at a pressure of 180-220 MPa for 10-30 minutes and by a hot pressing process performed at a temperature of 350-450° C. at a pressure of 180-220 MPa for from 10 minutes to 5 hours.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, the present invention will be described in detail with reference to the accompanying drawings.

Figure 1:
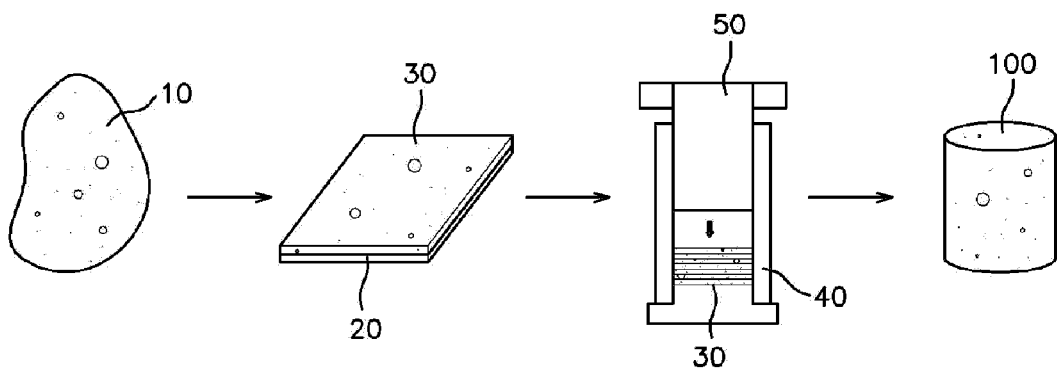
FIG. 1 is a schematic diagram showing a method for manufacturing a functional material according to the present invention.

FIG. 1 is a schematic diagram showing a method for manufacturing a functional material according to the present invention. As shown therein, the present invention relates to a method for manufacturing a functional material, the method comprising mixing powders composed of the components of the functional material with a binder to prepare a mixed paste 10, coating the mixed paste 10 on a substrate 20, and separating the coated material from the substrate 20 to prepare a thick film slice 30 consisting of the component of the functional material.

In addition, the method comprises stacking the slices 30 in a predetermined mold 40 and pressing the stacked slices 30 with a press 50 at a predetermined temperature and pressure. According to the inventive method, a multifunctional material 100 which shows anisotropy and whose physical properties change according to height may be manufactured in a simple manner.

In another embodiment, a functional material which shows anisotropy and has physical properties changing in a graduating manner according to height may be manufactured by providing different kinds of materials corresponding to the components of the functional material, preparing each of the different kinds of materials into the mixed paste of step (1), preparing slices from the paste, stacking the slices corresponding to each of the different kinds of materials in a mold, and compressing the stacked slices. Also, the functional material may be manufactured such that the thicknesses of the slice stacks consisting of the different materials differ from each other.

For example, if a functional material is composed of three materials of A, B and C, each of the A, B and C slices is prepared, and the prepared slices are stacked in a mold and pressed, thus manufacturing an anisotropic material whose components differ according to height. If necessary, sheets of the A slices, 40 sheets of the B sheets and 50 sheets of the C slices may sequentially be stacked in the mold and pressed, thus manufacturing not only an anisotropic material having components differing according to height, but also a material having physical properties which change according to height, because the thickness of the components thereof change according to height.

The functional material may be a metal material, a ceramic material, a semiconductor material, an organic material or the like. In addition, the functional material may be any material having electrical, mechanical, optical and thermal properties which anisotropically change or change in a graduated manner. Particularly, the functional material may be used as a thermoelectric material having important electrical and thermal properties.

Furthermore, carbon nanotubes may additionally be added to the components for preparing the mixed paste in order to further improve the electrical conductivity of the functional material.

Moreover, the binder is added in amount of 10-30 parts by weight based on 100 parts by weight of the mixed paste and comprises one selected among organic materials including thermoplastic resins, thermosetting resins, photocurable resins, silane compounds, polymeric copolymers, self-assembled resins, and combinations thereof.

Hereinafter, a thermoelectric material among functional materials manufactured according to a preferred embodiment of the present invention will be described with reference to the accompanying drawings.

To manufacture a thermoelectric material according to the present invention, the component of the thermoelectric material, which is a BiTe-based material, preferably $(Bi_xSb_{1-x})_2Te_3$, and more preferably $(Bi_{0.75}Sb_{0.25})_2Te_3$, is provided in powdered form having a particle size of about 500 μm. In addition, as carbon nanotubes, multi-wall carbon nanotubes having a core diameter of about 20 nm and a length of about 400 μm are used. As the binder, polyurethane is used.

The $(Bi_{0.75}Sb_{0.25})_2Te_3$ powder, the carbon nanotubes and the binder are uniformly mixed in a ball mill to prepare a mixed paste. Herein, the carbon nanotubes and the binder are added in amounts of 3 parts by weight and 15 parts by weight, respectively, based on 100 parts by weight of the paste.

When the preparation of the mixed paste has completed, the mixed paste is coated on a substrate, preferably a copper (Cu) foil, by a screen coating process. After the paste has dried naturally for a predetermined time, the coated material is separated from the copper foil, thus preparing a thick film slice. By repeating the coating and separation process, a plurality of slices are prepared such that a thermoelectric material having the desired thickness and thermoelectric performance may be obtained.

The slices are stacked in a mold and subjected to a cold pressing process at room temperature at a pressure of 200 MPa for 15 minutes and to a hot pressing process at a temperature of 350-450° C. at a pressure of 180-220 MPa for from 10 minutes to 5 hours. The pressed material is separated from the mold, thus manufacturing a thermoelectric material of a predetermined size and shape.

Figure 2A:
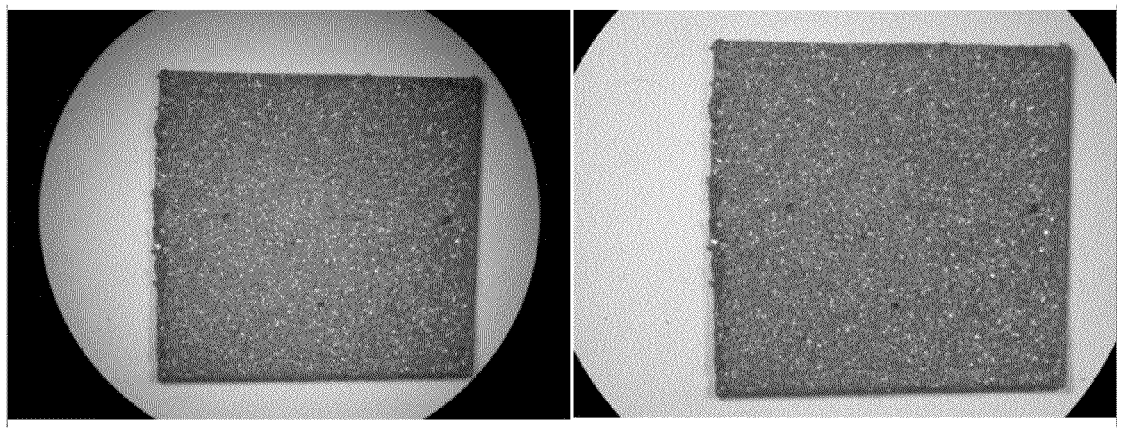
FIG. 2 illustrates an optical micrograph (a), Fe-SEM photograph (b) and EDS date (c) of a slice separated from a copper foil according to an embodiment of the present invention.
Figure 2B:
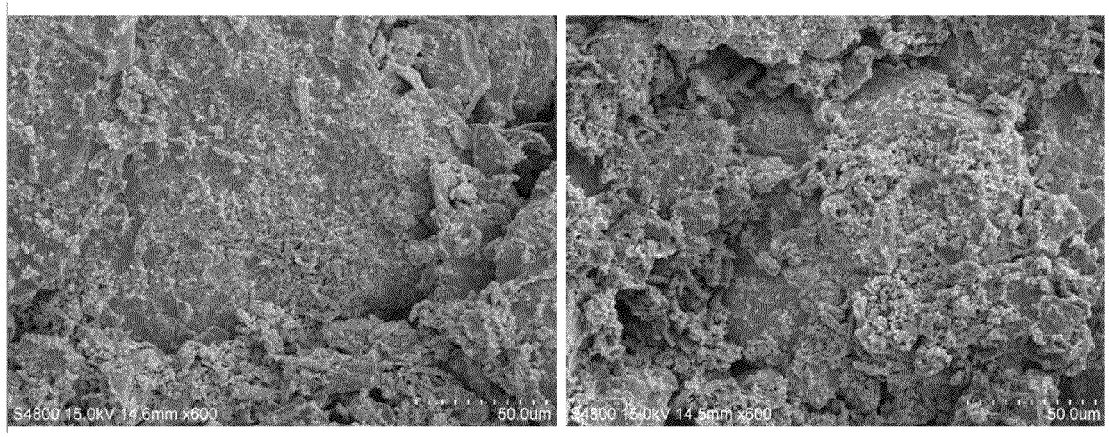
Figure 2C:
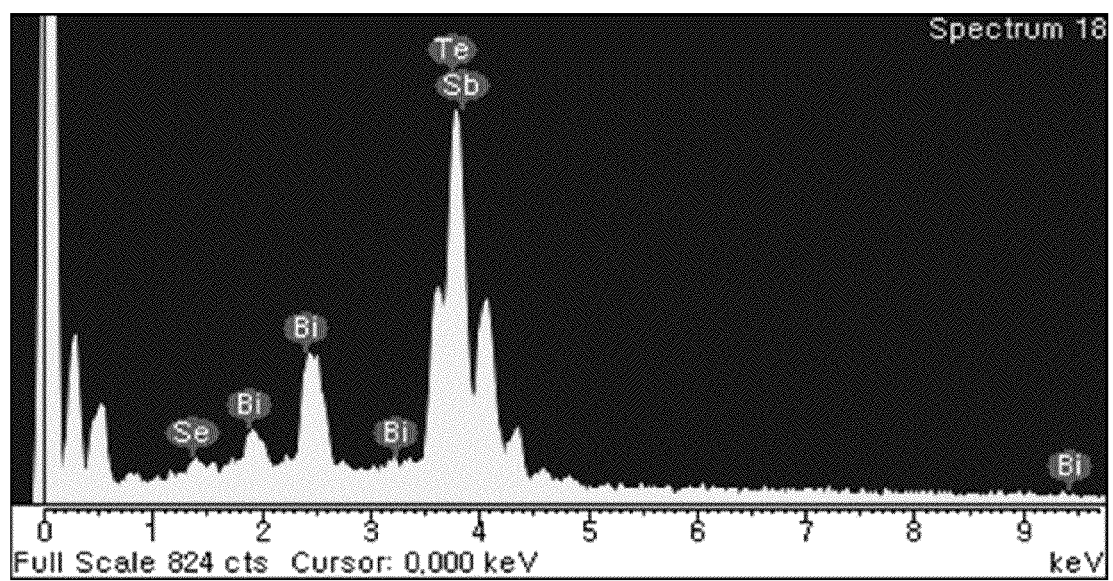

FIG. 2 illustrates an optical micrograph, Fe-SEM photograph and EDS date of a slice separated from the copper foil. As may be seen in FIG. 2, a slice composed of the component of the thermoelectric material was prepared.

Figure 3:
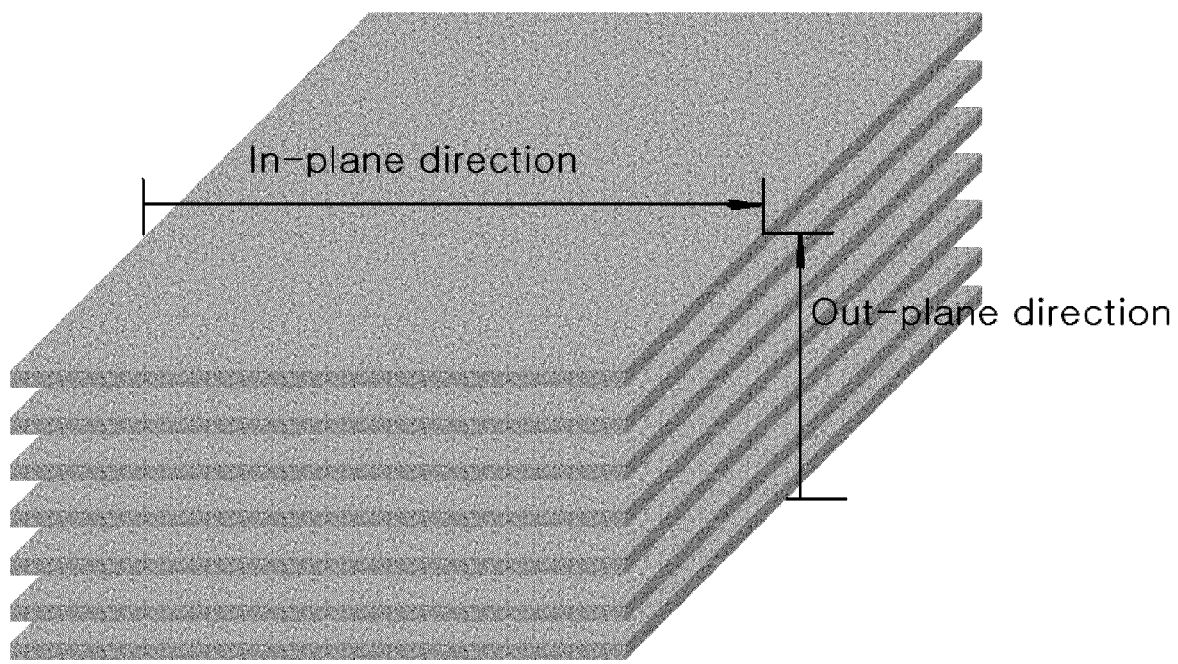
FIG. 3 shows the in-plane direction and out-plane direction with respect to the surface of a thermoelectric material manufactured according to the present invention, the directions being defined to measure the anisotropy of the thermoelectric material.

FIG. 3 shows the in-plane direction and out-plane direction with respect to the surface of the thermoelectric material manufactured according to the present invention, the directions are being defined to measure the anisotropy of the thermoelectric material.

Figure 4:
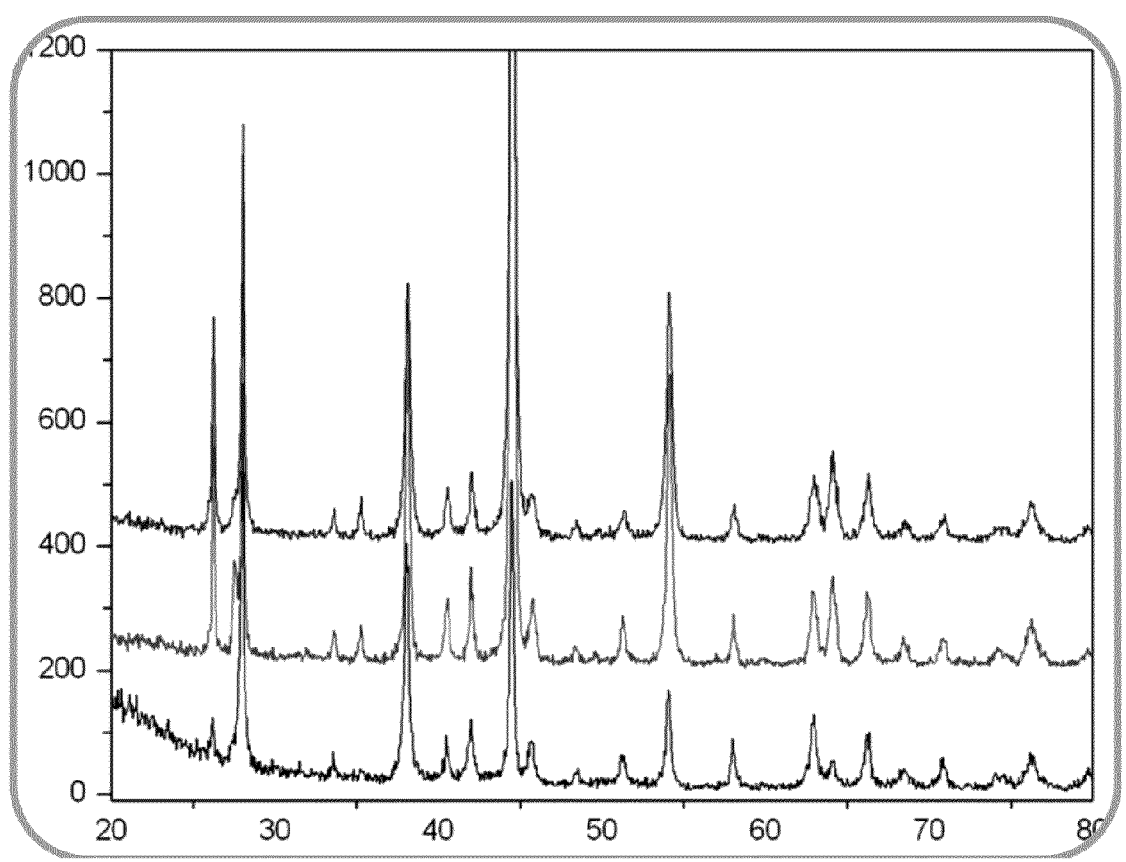
FIG. 4 shows the XRD data of a thermoelectric material manufactured according to the present invention.

FIG. 4 shows the XRD data of a thermoelectric material manufactured according to the present invention and shows data for a sample prepared by cold pressing (400 MPa) and hot pressing (at 400° C. for 2 hours, and at 400° C. for 30 minutes). As may be seen in FIG. 4, the thermoelectric material showed the typical XRD results of $(Bi_{0.75}Sb_{0.25})_2Te_3$.

Figure 5:
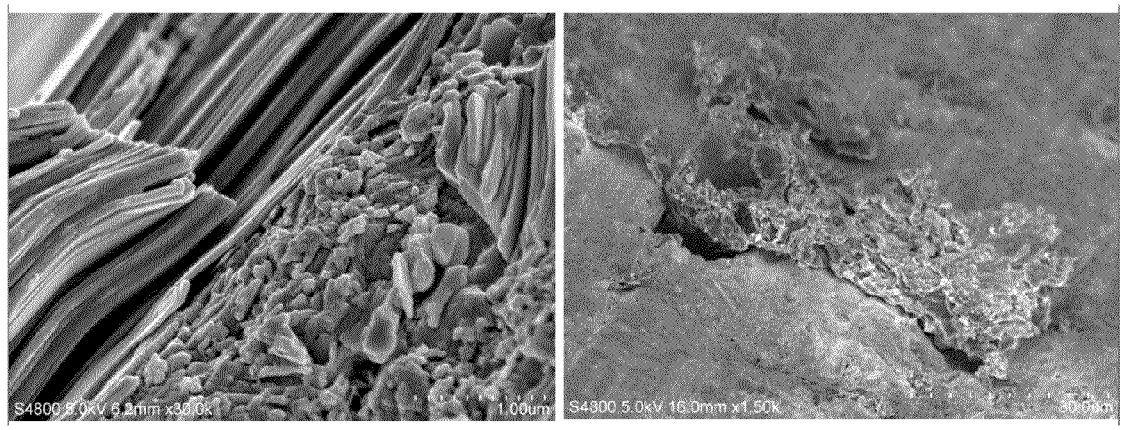
FIG. 5 illustrates SEM photographs showing the morphology of a thermoelectric material manufactured according to the present invention.

FIG. 5 illustrates SEM photographs showing the morphology of the thermoelectric material manufactured according to the present invention. As may be seen in FIG. 5, a mixed morphology of lamellae and rods could be observed, and micropores of about 10 μm were irregular. This is thought to be attributable to the oxidation of the binder during the hot pressing process. Also, the thermoelectric material had a density of 6.582 g/cm$^3$ which was lower than that of bulk-type $(Bi_{0.75}Sb_{0.25})_2Te_3$ by about 12%.

Figure 6:
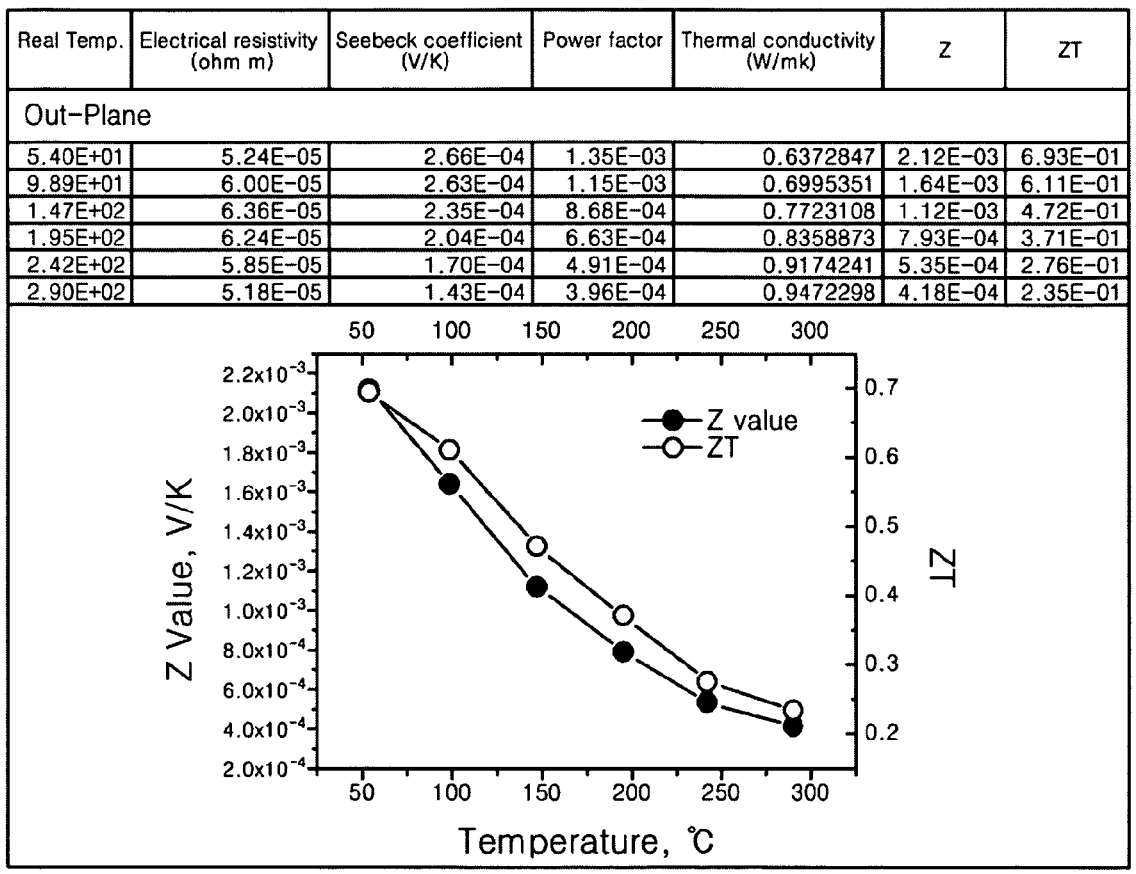
FIG. 6 shows the thermoelectric performance date of a thermoelectric material according to the present invention, measured in the out-plane direction with the surface of the thermoelectric material.

FIG. 6 shows the thermoelectric performance date of the thermoelectric material according to the present invention, measured in the out-plain direction with respect to the surface of the thermoelectric material. Specifically, FIG. 6 shows measurement results for the electrical resistivity, Seeback coefficient, power factor, thermal conductivity, figure of merit (Z) and dimensionless figure of merit (ZT) of the thermoelectric material according to the present invention.

As shown in FIG. 6, the thermoelectric material had an electrical resistivity higher than that in the in-plane direction to be described later. Also, it had a relatively high dimensionless figure (ZT) of merit reaching a maximum of 0.69.

Figure 7:
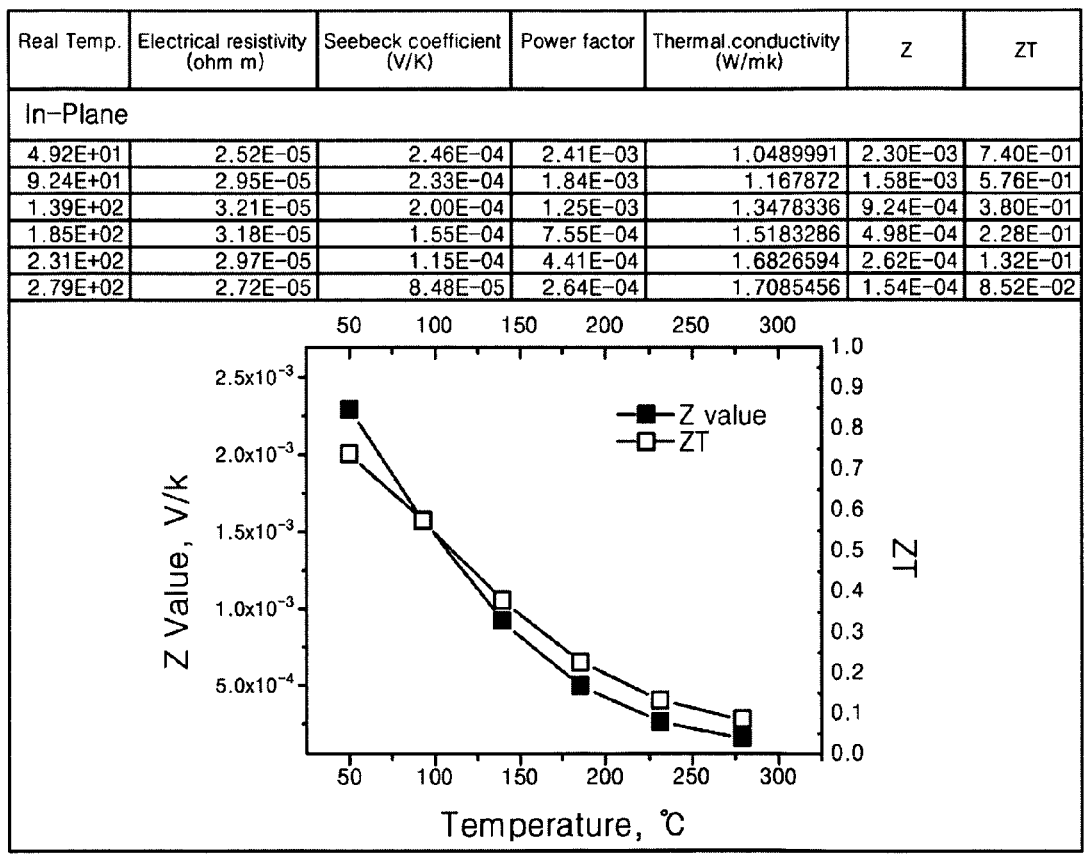
FIG. 7 shows the thermoelectric performance date of a thermoelectric material according to the present invention, measured in the in-plane direction with the surface of the thermoelectric material.

FIG. 7 shows the thermoelectric performance data of the thermoelectric material according to the present invention, measured in the in-plain direction with respect to the surface of the thermoelectric material. Specifically, FIG. 6 shows measurement results for the electrical resistivity, Seeback coefficient, power factor, thermal conductivity, figure of merit (Z) and dimensionless figure of merit (ZT) of the thermoelectric material according to the present invention.

As shown in FIG. 7, the thermoelectric material had an electrical resistivity lower than that in the out-plane direction. Also, it had a relatively high dimensionless figure of merit (ZT) reaching a maximum of 0.74.

As described above, the thermoelectric material according to the present invention has an anisotropy of about 7% and may be applied as a thermoelectric material by virtue of having sufficient anisotropy. Also, it has a high Seebeck coefficient, low conductivity and low electrical resistivity compared to those of the prior thermoelectric material and, as a result, can show a high dimensionless figure of merit. Thus, according to the present invention, a thermoelectric material having excellent thermoelectric performance may be manufactured.

According to the present invention, a multifunctional material, such as an anisotropic material having physical properties which differ according to the direction of material, or a material having physical properties which change in a graduated manner according to height, may be manufactured in a simple and economical manner. This multifunctional material has applications in various industrial fields.

Furthermore, if thermoelectric material is the functional material and the thermoelectric material is manufactured according to the present invention, it can have a high Seebeck coefficient, low thermal conductivity and low electrical conductivity compared to those of the prior thermoelectric materials, and thus it can have a high dimensionless figure of merit. In addition, the thermoelectric material according to the present invention has an anisotropy of about 7% in the in-plane direction and out-plane direction with respect to the surface, and thus may be used in various fields of application.

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a functional material by the stacking and pressing of slices, the method comprising the steps of:
   (1) mixing powders composed of the components of the functional material with a binder to prepare a mixed paste, said binder in an amount of greater than 25 parts by weight to 30 parts by weight based on 100 parts by weight of the mixed paste, and wherein said binder comprises one selected from thermoplastic resins, thermosetting resins, photocurable resins, silane compounds, polymeric copolymers, self-assembled resins, and combinations thereof;
   (2) coating the mixed paste on a substrate to form a coated material, and then separating the coated material from the substrate, thus preparing a slice;
   (3) repeating step (2) to prepare a plurality of slices, and stacking the slices in a mold; and
   (4) pressing the stacked slices at a predetermined temperature and pressure.

2. The method of claim 1, comprising preparing different kinds of materials constituting the components of the functional material, preparing each of the different kinds of materials into the mixed paste of step (1), preparing the slices of step (2), stacking the slices corresponding to each of the different kinds of materials in the mold (step 3), and subjecting the stacked slices to the pressing process of step (4).

3. The method of claim 2, wherein the thicknesses of the slice stacks consisting of the different materials differ from each other.

4. The method of claim 1, wherein the functional material is an anisotropic material, a material having physical properties which change according to height in a graduated manner, or a thermoelectric material.

5. The method of claim 4, wherein the functional material is composed of any one selected from among a metal material, a ceramic material, a semiconductor material and an organic material.

6. The method of claim 4, wherein thermoelectric material is $(Bi_xSb_{1-x})_2Te_3$.

7. The method of claim 1, wherein carbon nanotubes are added to the mixed paste of step (1) in an amount of 0.1-5 parts by weight based on 100 parts by weight of the mixed paste.

8. The method of claim 1, wherein the substrate in step (2) is a copper (Cu) foil.

9. The method of claim 1, wherein step (2) is carried out using a screening coating process.

10. The method of claim 1, wherein step (4) is carried out by a cold pressing process performed at room temperature under a pressure of 180-220 MPa for 10-30 minutes and by a hot pressing process performed at a temperature of 350-450° C. under a pressure of 180-220 MPa for from 10 minutes to 5 hours.

* * * * *